United States Patent [19]

Arai

[11] 3,829,882

[45] Aug. 13, 1974

[54] VARIABLE RESISTANCE FIELD EFFECT TRANSISTOR

[75] Inventor: Michio Arai, Tokyo, Japan

[73] Assignee: Sony Corporation, Tokyo, Japan

[22] Filed: Feb. 12, 1973

[21] Appl. No.: 331,350

[30] Foreign Application Priority Data

Feb. 12, 1972 Japan .............................. 47-15132

[52] U.S. Cl. ............ 357/23, 317/235 R, 317/235 B

[51] Int. Cl. .......................................... H01l 11/14

[58] Field of Search ..................... 317/235 B, 235 A

[56] References Cited

UNITED STATES PATENTS

| | | | |
|---|---|---|---|
| 3,339,128 | 8/1967 | Olmstead | 317/235 |
| 3,374,406 | 3/1968 | Wallmark | 317/235 |
| 3,657,573 | 4/1972 | Maute | 307/304 |
| 3,719,866 | 3/1973 | Naber | 317/235 R |

*Primary Examiner*—Martin H. Edlow
*Attorney, Agent, or Firm*—Hill, Gross, Simpson, Van Santen, Steadman, Chiara & Simpson

[57] ABSTRACT

A variable resistance field effect transistor with a wide range of resistance and a linear ohmic characteristic having one or more small channels and one or more large channels formed by a gate region between a source region and a drain region in which both the small and large channels are located closer to the source electrode than to the drain electrode. The field effect transistor is such that as the gate voltage is changed from full drain current flow to pinch-off, the small channels are pinched off at first, after which the large channel or channels will reach a pinch-off voltage. In depletion type field effect transistors, with zero voltage on the gate electrode, the entire current through all of the small channels is much larger than the total current flowing through the large channels. The small channels may be of different size, since even if one channel is pinched off at a certain gate voltage, the next larger channel is not pinched off at that voltage. In another embodiment, the gate region is such that the channel area is gradually increased so that the pinch-off voltage is also gradually changed in accordance with the size of the channel.

5 Claims, 40 Drawing Figures

VARIABLE RESISTANCE FIELD EFFECT TRANSISTOR

FIELD OF THE INVENTION

This invention relates to an ohmic field effect transistor and more particularly to a variable resistance field effect transistor which has a wide range of resistance and a linear ohmic characteristic.

BACKGROUND OF THE INVENTION AND PRIOR ART

Field effect transistors have found many uses including uses as voltage controlled resistors. It was recognized at an early date that by varying the voltage on the gate electrode of a field effect transistor, the effective resistance in the drain-source path could be varied. It is well recognized that a typical characteristic curve of the drain current plotted against the drain-source voltage has at first a rather steeply rising portion which might be referred to as the ohmic region, then a relatively sharp knee and a relatively flat portion which is usually referred to as the pinch-off region, and then an abrupt, nearly vertical rise, which is usually referred to as the breakdown region.

The difficulty in using a field effect transistor as a variable resistance has been the lack of relatively true linearity over a wide range of gate voltages and the lack of a wide range of resistance values for variations in applied voltage. In order to fully understand the present invention, it is believed desirable to refer to, and briefly describe, two known forms of prior art device.

Figure 1:
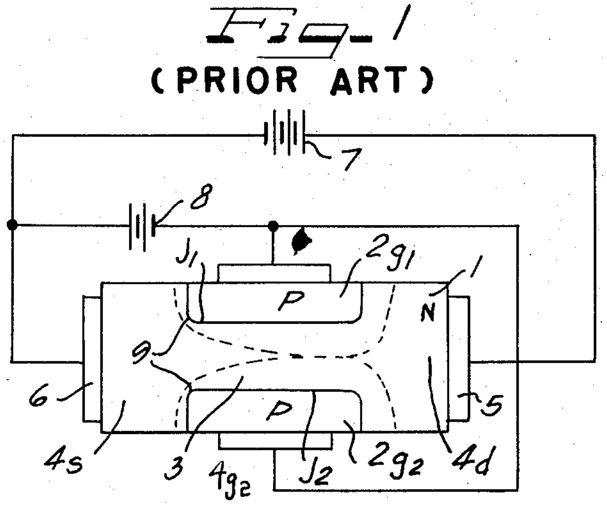
FIG. 1 (PRIOR ART)
FIG. 1 is a diagrammatic cross sectional view showing a typical junction type field effect transistor well known in the prior art.
Figures 2, 3, 4:
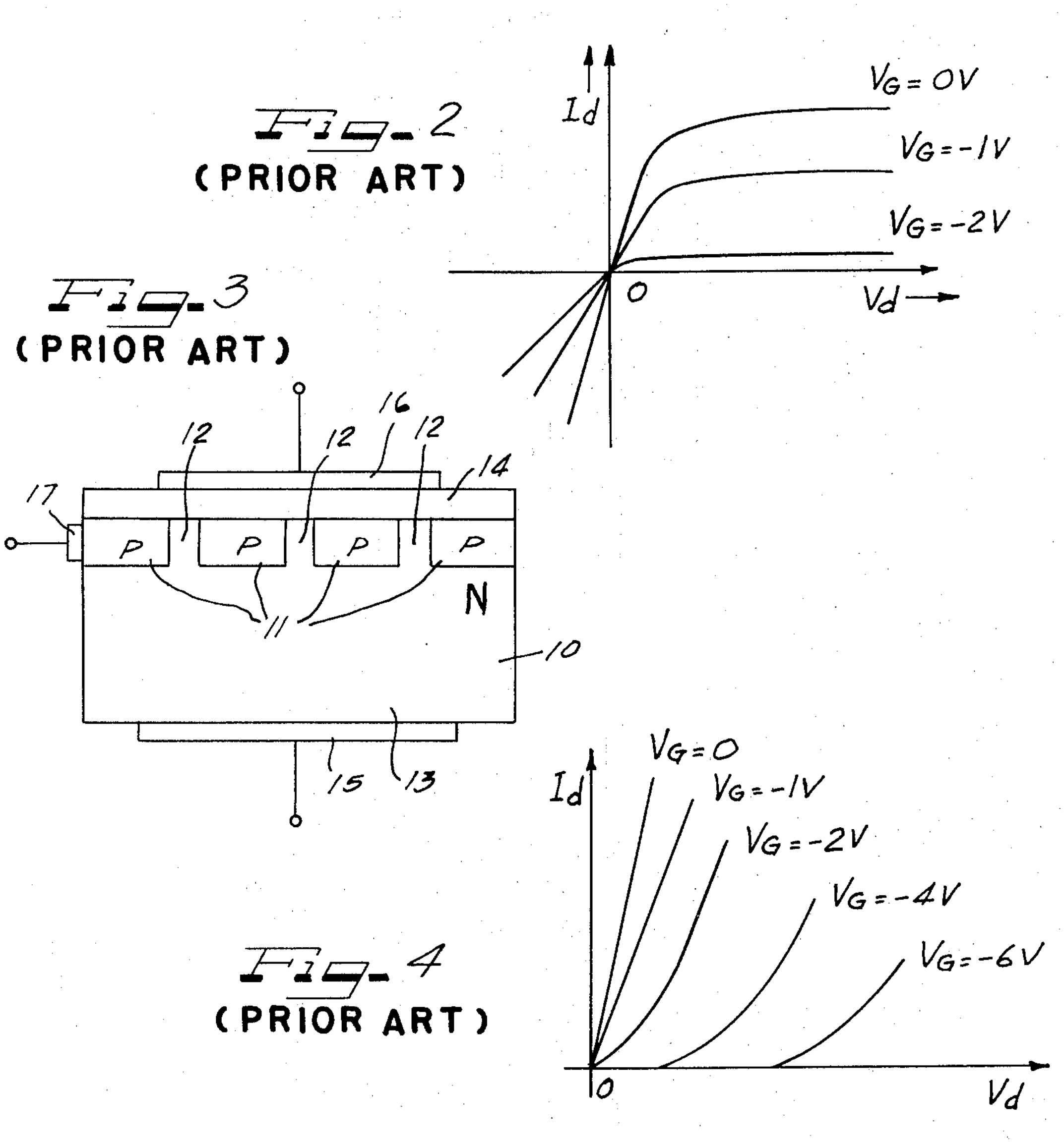
FIG. 2 (PRIOR ART), FIG. 3 (PRIOR ART), FIG. 4 (PRIOR ART)
FIG. 2 is a plot of the drain to source voltage versus drain current, showing the characteristics of the prior art device of FIG. 1.
FIG. 3 is a diagrammatic sectional view of another form of prior art type of field effect transistor having multiple channels of uniform cross sectional area and having the gate region closer to the source electrode than to the drain electrode.
FIG. 4 is a plot showing the characteristics of the field effect transistor of FIG. 3 and particularly a plot of the drain to source voltage versus drain current.

In FIG. 1, there is illustrated a well known junction type field effect transistor comprising a substrate 1 of N-type semiconductor material in which two P-type semiconductor regions have been formed as gates 2g1 and 2g2. As is well known, pn junctions are formed as indicated at $J_1$ and $J_2$. Drain and source regions $4_d$ and $4_s$ respectively, are, of course, present at opposite ends of the substrate and formed on these regions are a drain electrode 5 and source electrode 6 respectively. The region extending between the drain region $4_d$ and the source region $4_s$ is a channel region 3. A battery 7 is connected across the drain and source electrodes so as to apply a positive bias to the drain with respect to the source. The gate electrodes are 4g1 and 4g2. A negative source of potential 8 is applied to the gate electrodes 4g1 and 4g2. The dotted lines 9 indicate the depletion region created by the negative bias on the gate electrode when the bias is sufficiently high to reach cut-off. It will be understood that the boundaries of the depletion layers as shown by the dotted lines in FIG. 1 are controlled by the amount of bias voltage supplied to the gate electrodes 4g1 and 4g2. FIG. 2 is a plot of the characteristics of the voltage-current characteristics with different applied voltages at the gate. As a general situation, the device of FIG. 1 exhibits non-linear characteristics. Devices of the type shown in FIG. 1 have found use as an amplifier, but they have not found use in an AGC circuit, nor have they found any real acceptance as non-contact variable resistance devices.

In order to compensate for the above defects, and in order to get a more linear $V_d - I_d$ characteristic, it has been proposed that the location of the gate region be fixed closer to the source electrode than to the drain electrode so that the gate bias voltage is not interfered with by the positive drain bias. A prior art device of this type is illustrated in FIG. 3. The known prior art device of this type is one which has a plurality of channels of equal width with the channel regions being located closer to the source electrode than to the drain electrode. Specifically, as shown in FIG. 3, there is a semiconductor substrate 10 of N-type semiconductor material into which there is formed, by diffusion or otherwise, four gate regions 11 between which are located channels 12 all of which are the same size. The drain region 13 is located generally in the lower part of the substrate 10, while the source region 14 is located in the upper part of the substrate 10. A drain electrode 15 is formed on the bottom of the substrate 10 and a source electrode 16 is formed on the upper part of the substrate. A gate electrode 17 is formed at one end of the gate regions 11. While not shown, it will be understood that the gate region is in the form of a layer in which windows are formed to provide the channels 12. It is to one end of this layer that the gate electrode 17 is formed. In this prior art form of the invention, it is noted that the gate region is closer to the source electrode than to the drain electrode, but the advantages of the present invention are not obtained because all of the channels are of uniform width. The $V_d - I_d$ characteristic of the device of FIG. 3 is shown in FIG. 4, the curves being shown for a number of different gate bias voltages. It will be noted in this form of structure, that the point for zero drain current for different applied gate voltages is not at zero for all gate voltages. For example, where the curves $V_g = -4V$ and $V_g = -6V$, the zero current point is not at zero drain voltage, thus where the $V_g = -6V$ crosses the zero axis, there is an avalanche breakdown, and this avalanche breakdown voltage occurs when $V_g = -6V$. To explain this matter in a somewhat different manner, if the gate bias voltage $V_g$ is increased, and then the bias around the channel is reached at the pinch-off voltage, the drain current $I_d$ will flow through the channel again as the drain voltage is increased. This threshold drain voltage which causes drain current to flow is dependent on the gate voltage. This is similar to the characteristics of a triode, and hence this type of field effect transistor may be used as an amplifier, but cannot reasonably be used as a variable resistance device, since it does not have a linear $V_d - I_d$ characteristic plotted for $V_g$ as a parameter. This field effect transistor has a non-linear characteristic. When the channels are not filled with the depletion layer, the substrate between the source and drain electrodes is supplied with a uniform electric field. However, in the next step when the channels are filled with the depletion layer, the channel reaches the pinch-off condition and current flow through the channels is prevented. Meanwhile, since the electric field is concentrated in these depletion layers, the electrons in the valence band are energized by the accellerated electrons in the depletion layer as the drain voltage $V_d$ is increased. As a result of this, which is often called the avalanche breakdown, the free electrons and the holes serve to cause the drain current $I_d$ to again flow.

BRIEF SUMMARY OF THE INVENTION

It is an object of the present invention to provide a novel variable resistance field effect transistor having a linear $V_d - I_d$ characteristic plotted for substantially any gate voltage $V_g$ as a parameter. In other words, as the specific gate voltage $V_g$ is assumed, the field effect transistor has a constant resistance even if the drain voltage $V_d$ is widely changed. Thus, the resistance is expressed as a linear equation controlled by the gate voltage.

DESCRIPTION OF THE PREFERRED EMBODIMENT

Figure 5:
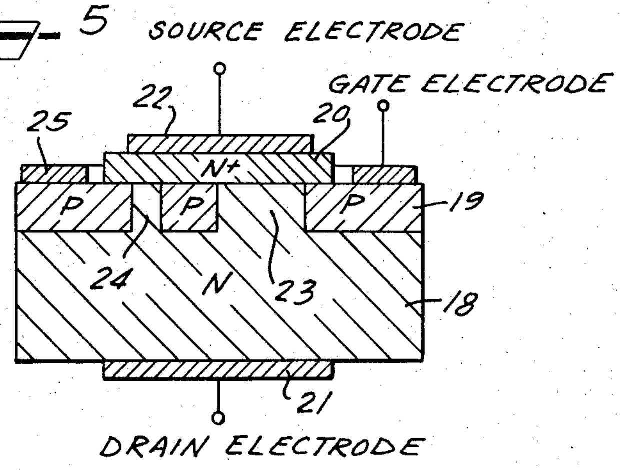
FIG. 5 is a diagrammatic sectional view of a field effect transistor embodying the typical teachings of the present invention, wherein multiple channels are employed having different cross sectional area and in which the gate region is closer to the source electrode than to the drain electrode.

FIG. 5 is a simple form of structure exemplifying the principles of the present invention. It includes a substrate 18 of N-type material having a layer 19 forming the gate region of P-type material and having a layer of N+ -type material 20 forming the source region. The drain region which is the main bottom part of the substrate 18 has a drain electrode 21 formed on its lower surface and the source region 20 has a source electrode 22 formed on the upper surface thereof. The gate region 19 has windows 23 and 24 formed therein through which extends a portion of the substrate material. These windows 23 and 24 form a relatively wide channel and a relatively narrow channel respectively. A gate electrode 25 is formed on the upper marginal portion of the gate region 19. It will be noted that the gate region is closer to the source electrode than it is to the drain electrode, and it will furthermore be noted that the width of the channels 23 and 24 are substantially different from each other.

Figure 6:
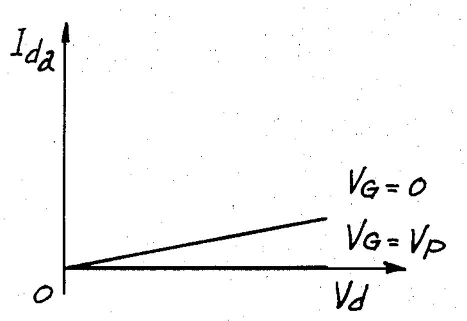
FIG. 6 is a plot of the $V_d - I_d$ characteristics of the current flow through the small channel of the embodiment of the invention shown in FIG. 5.
Figure 7:
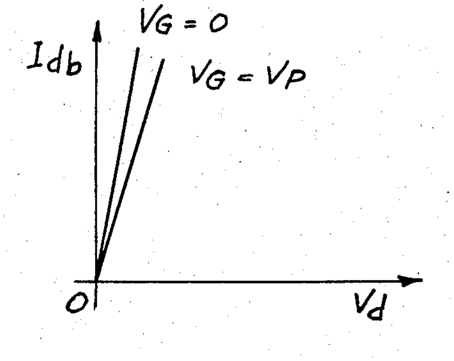
FIG. 7 is a plot of the $V_d - I_d$ characteristics of the current flow through the large channel of the embodiment of the invention shown in FIG. 5.
Figure 8:
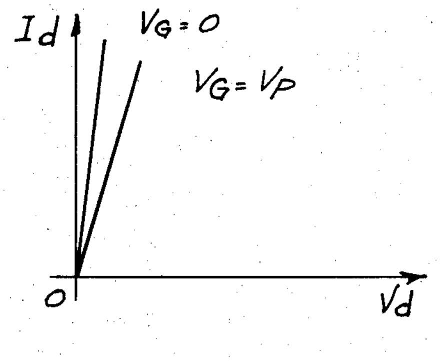
FIG. 8 is a plot of the combined $V_d - I_d$ characteristics of the field effect transistor of FIG. 5.

It will readily be appreciated from examining FIG. 5, that the small channel 24 becomes pinched off at a lower gate bias voltage than does the large channel. Consequently, since the entire current which is to be supplied from the drain electrode to the source electrode can flow through the large channel 23 regardless of the small channel 24, the depletion layer in the small channel is prevented from concentrating the electric field. In considering the operational aspects of the device of FIG. 5, it will be noted that the current flowing through the small channel for different values of drain voltage is represented in FIG. 6. It will be noted that at pinch-off voltage, there is substantially no drain current flowing through channel 24. FIG. 7 exemplifies the current flowing through the large channel 23 when the gate voltage is zero and when the gate voltage reaches pinch-off voltage of the small channel ($V_g = V_p$). If the gate voltage increases above the pinch-off voltage, $V_p$, the $V_d$-$I_d$ characteristic of the large channel becomes similar to that of FIG. 4 and the non-linear characteristic appears. To obtain the linear characteristic, the gate voltage should be selected between 0 and $V_p$. FIG. 8 represents the combined characteristic of the two channels of FIG. 5. However, the ratio of changing resistance is not large sufficient for a variable resistance.

Figure 9:
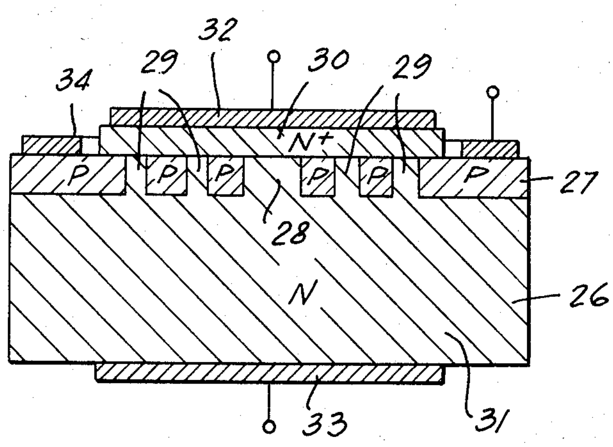
FIG. 9 is a diagrammatic sectional view of a preferred embodiment of the variable resistance field effect transistor formed in accordance with the principles of the present invention.
Figure 10:
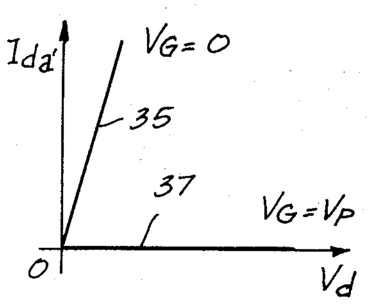
FIGS. 10 and 11 are plots showing the $V_d - I_d$ characteristics of the embodiment shown in FIG. 9, plotted for $V_g$ (the gate voltage) as a parameter for a small channel and a large channel of FIG. 9.
Figure 11:
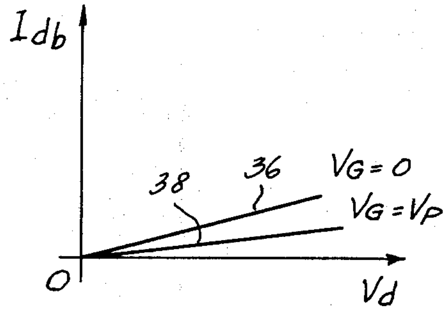
Figure 12:
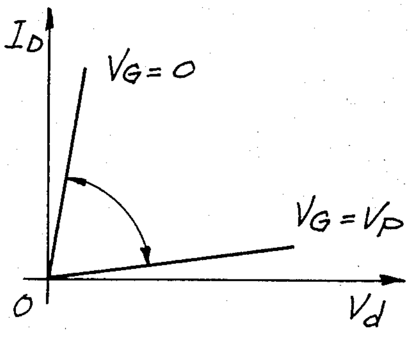
FIG. 12 is a plot showing the $V_d - I_d$ characteristic combining the characteristics of FIG. 10 and FIG. 11.

A preferred embodiment of the present invention is illustrated in FIG. 9. There is shown a field effect transistor having an N-type substrate 26 in which is formed a layer 27 of P-type material having a large central window 28 therein and a plurality of smaller width windows 29 up through which a portion of the substrate 26 extends. An N+-type layer 30 is formed on the gate region layer 27 to provide a source region. The main body part of the substrate 26 provides a drain region 31. An ohmic contact 32 is formed on the source region 30 and an ohmic contact 33 is provided on the drain region 31. A circular ring electrode 34 is formed on the gate region 27. In this form of the invention, the combined width of the small channels 29 is greater than the width of the large channel 28. The plots of FIGS. 10, 11 and 12 show the characteristics of the device of FIG. 9 for the small channels, the large channel and the combined channels. The structure is such that the entire current flowing through all of the small channels 29 for $V_g = 0$ is larger than the current flowing through the large channel on $V_g = 0$. As exemplified by the graphs, the angle of the solid line 35 subtended by the $V_d$ axis in FIG. 10 is much larger than the angle of the line 36 subtended by the $V_d$ axis in FIG. 11. This means that the line 35 indicates much smaller resistance than that indicated by the line 36. In FIGS. 10 and 11, both lines 37 and 38 correspond to the gate voltage $V_g$ which induces pinch-off effect in the small channels 29. Hence, the whole $V_d - I_d$ characteristic for both the large channel and the small channels is expressed by sum of the $I_d - V_d$ characteristics of FIG. 10 and FIG. 11. It will be understood that the resistance is thus widely changed as the gate voltage is increased from $V_g = 0$ to $V_g = V_p$ (where $V_p$ = the pinchoff voltage).

Many variations of gate pattern may be employed and still obtain the novel characteristics of the present invention. For example, FIGS. 13, 14 and 15 indicate examples of variations in gate pattern.

Figure 13:
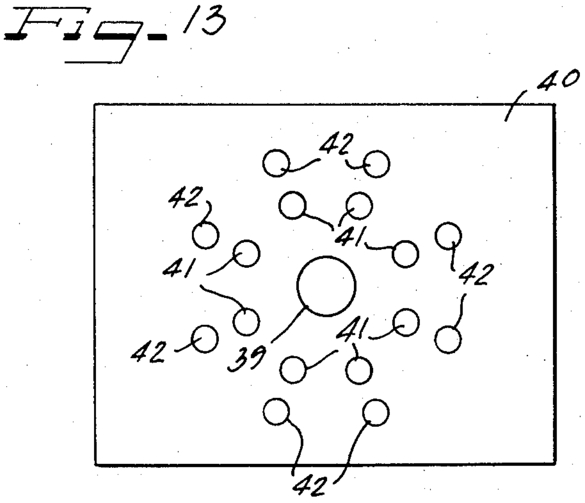
FIGS. 13, 14 and 15 are enlarged plan views showing three different kinds of gate regions which may be employed in embodiments of the present invention.

In FIG. 13, there is a large channel 39 centrally located in the gate region 40 and there are a plurality of small channels 41 and 42, small channels 41 being located in a concentric ring around large channel 39, while small channels 42 are located in a concentric ring around the small channels 41.

Figure 14:
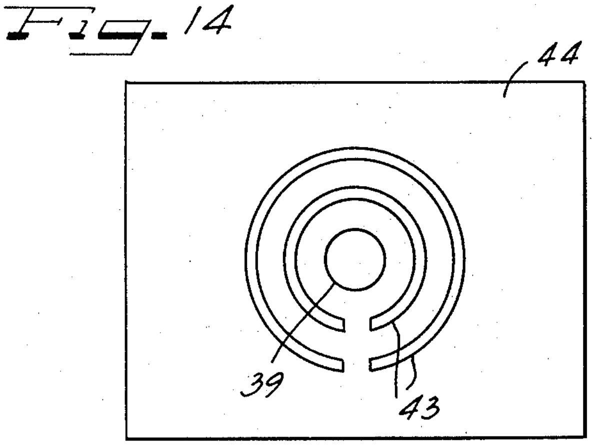

In FIG. 14, there are a plurality of ring shape small channels 43 located around a large channel 39 in a gate region 44. It will be noted that the small ring channels 43 are not completely closed.

Figure 15:
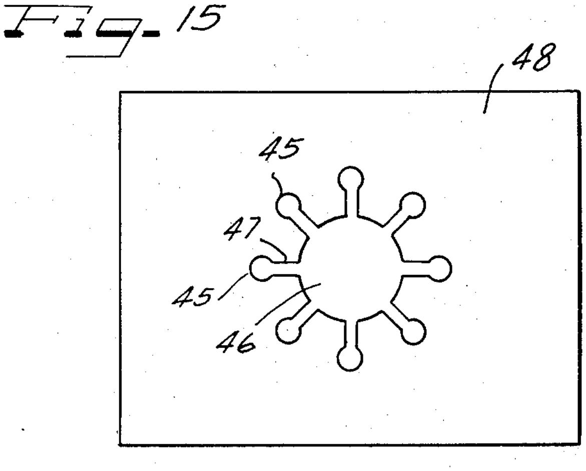
Figure 16A:
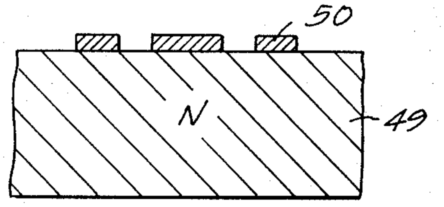
FIGS. 16A–D and 17A–D are views showing successive steps during the manufacture of a field effect transistor made in accordance with the teachings of the present invention.
Figure 17A:
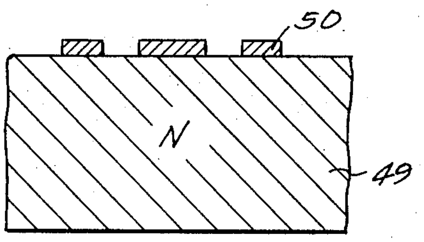
Figure 16B:
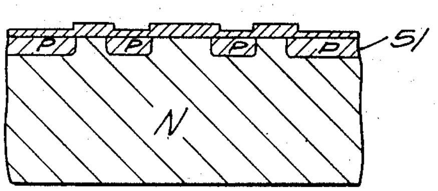
Figure 17B:
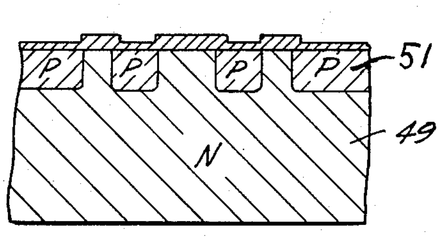
Figure 16C:
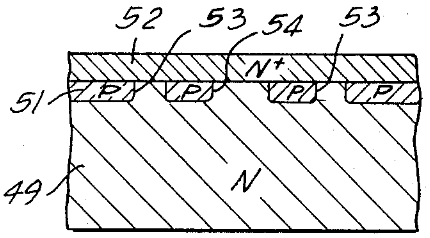
Figure 17C:
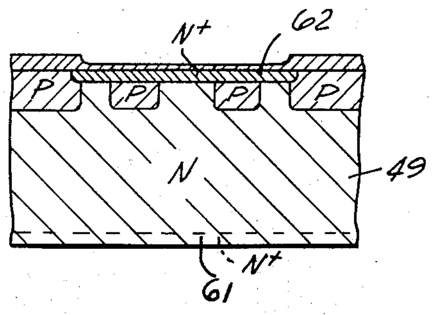
Figure 16D:
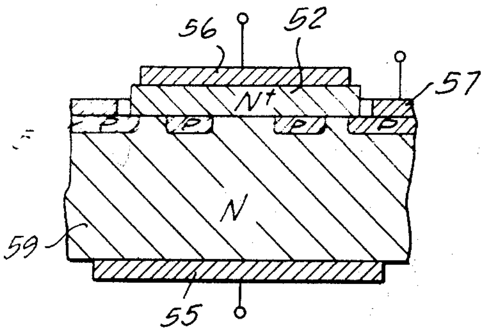
Figure 17D:
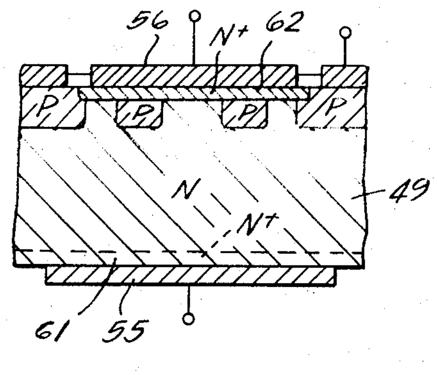

In FIG. 15, a plurality of small channels 45 are formed which are openly connected with the large channel 46 by radial regions 47. These channels are formed in a gate region 48.

FIG. 16 shows one method of forming a field effect transistor embodying the teachings of the present invention. More specifically, a block of semiconductor N-type material 49 is taken. A pattern mask 50 is then formed on the block 49 so that a layer 51 of P-type material may be formed except in the region covered by the mask 50. The mask layer 50 is then removed and a relatively high impurity N-type semiconductor material 52 is laid down. It will now be seen that a block has been formed which includes the substrate 49 which provides the drain region, a layer 51 which provides the gate region, and a layer 52 which provides the source region. The windows 53 and 54 in the gate region are the result of the location of the mask 50 which prevented the forming of the P-type layer 51 at such points.

Ohmic contacts 55, 56 and 57 are now formed on the drain region 49, the source region 52, and the gate region 51, respectively.

FIG. 17 shows a slightly different method of manufacturing the field effect transistor of the present invention. The method of FIG. 17 differs from that of FIG. 16 in that the masking layer, which may for example be silicon dioxide, during the diffusion of the P-type impurity, is removed by a well known photo etching technique. Then the relatively high N+-type impurity is diffused through the removed portion, previously described to form a source layer 62, and meanwhile, the N+-type impurity 61 (FIG. 17C) may be grown on the back surface of the block 49. Finally, the drain electrode 55 and the source electrode 56 are ohmic contacted to the drain layer 49 and the source layer 62.

Figure 18:
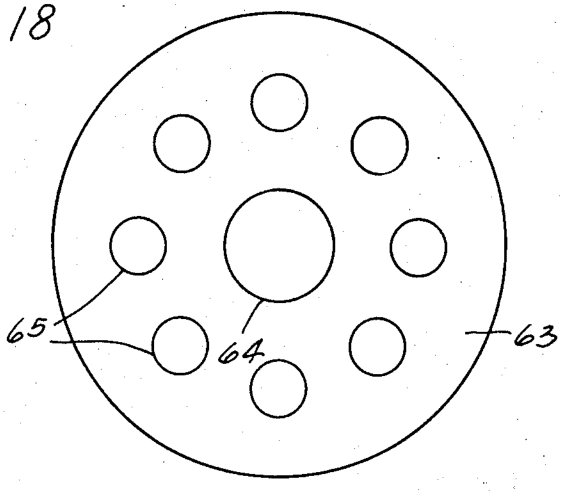
FIG. 18 is a diagrammatic horizontal sectional view showing a single large channel at the center and a plurality of small channels circumferentially arranged around the large channel.
Figure 19:
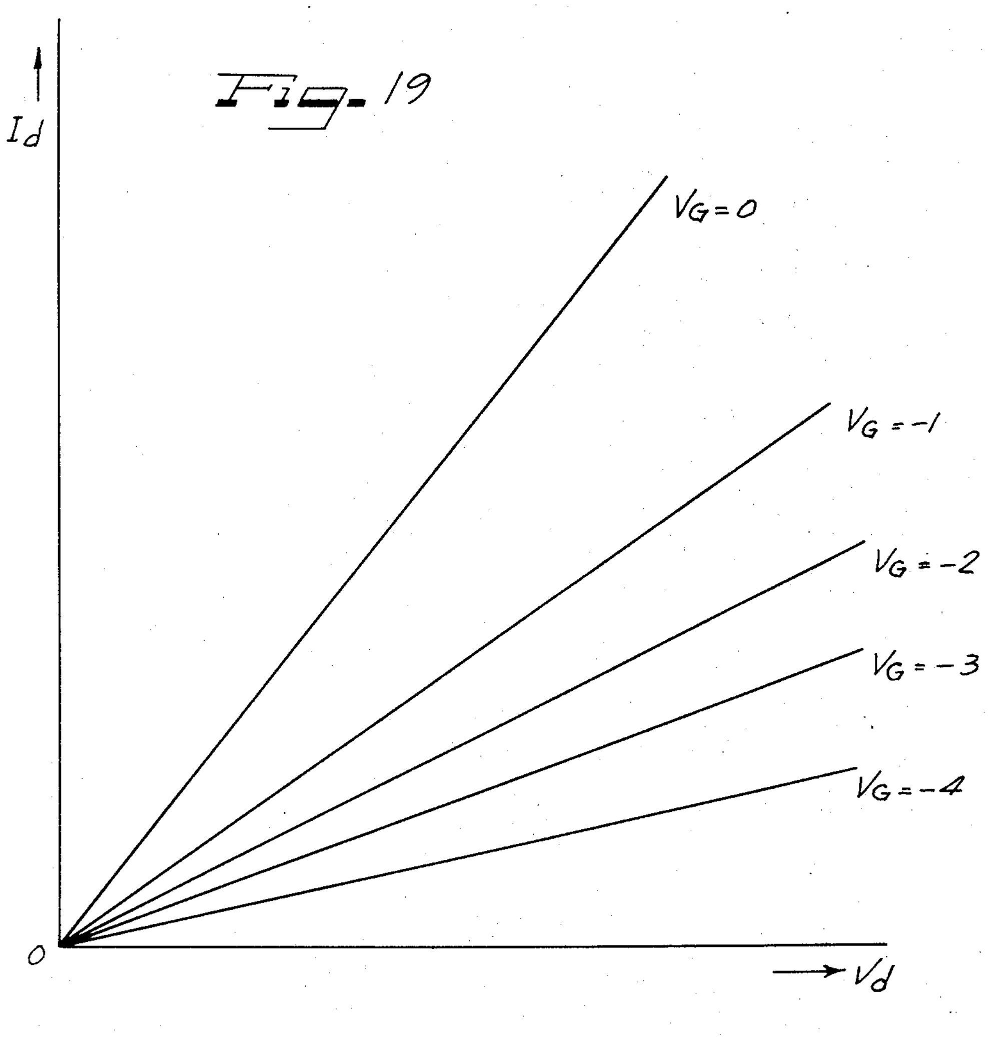
FIG. 19 is a diagrammatic plot showing the $V_d - I_d$ characteristics of the field effect transistor embodying this invention and having channels as shown in FIG. 18.

FIGS. 18 and 19 are an illustration of one specific preferred embodiment of the present invention together with the characteristic $V_d - I_d$ characteristic curve. In this embodiment the gate region 63 has one large centrally located channel 64 and eight small channels 65 uniformly arranged around the large channel 64. The small channels 65 are designed to have a pinch-off threshold of 5 volts and the large channel 64 is arranged to have a pinch-off threshold of 10 volts. The substrate (not shown in FIG. 18) is an N-type semiconductor material having a resistivity of approximately 40 ohm-cm. The diameter of the large channel 64 is approximately 23 microns, and the diameter of each of the small channels 65 is approximately 10 microns. The characteristics of this embodiment are shown in FIG. 19, wherein different gate voltages from zero to −4 volts are shown. It will be noted that the resistance is linear and that the variation of resistance is quite large as exemplified by the wide spread between the line for $V_g = 0$ and $V_g = -4$.

Three forms of metal-oxide field effect transistors embodying the present invention will now be described. All three have a sheet like channel arrangement in which, in effect, there are three parallel channels. Like the junction field effect transistors described above, one centrally located channel portion has a different pinch-off voltage than channel portions on either side thereof.

Figure 20:
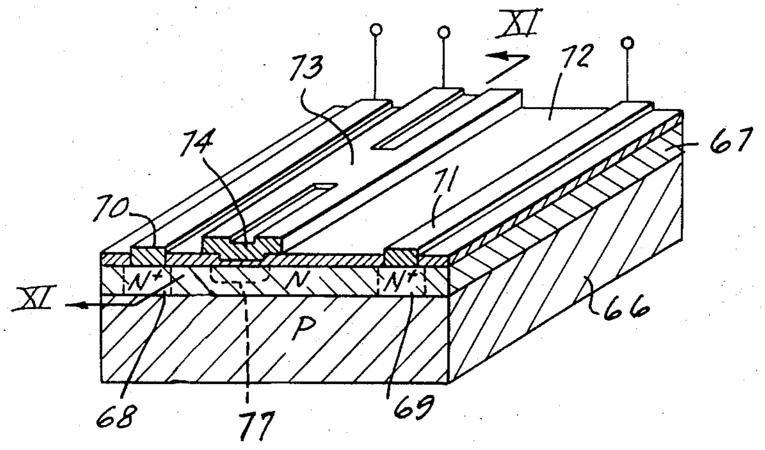
FIG. 20 is a diagrammatic isometric view of a depletion type of a metal oxide field effect transistor embodying the teachings of the present invention.
Figure 21:
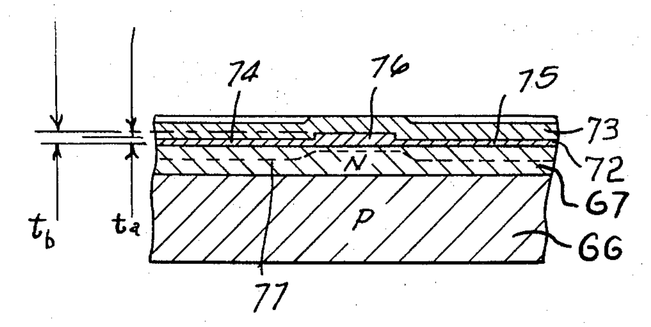
FIG. 21 is a sectional view of the device shown in FIG. 20 as shown along the line XXI—XXI thereof.

The transistor shown in FIGS. 20 and 21 is a depletion type having an epitaxially grown sheet shape n-type layer 67 on a p-type semiconductor substrate 66. Strip like portions are provided by diffusing impurity material to provide a source region 68 and a drain region 69. Source and drain electrodes 70 and 71 are deposited on the source and drain regions 68 and 69 respectively. A layer 72 of insulating material, such as $SiO_2$ is formed on the layer 67 except where the source and drain electrodes are located. A gate electrode 73 is provided which lies as a strip parallel to but spaced from source electrode 70 on the insulating layer 72. Portions 74 and 75 (FIG. 21) of insulating layer 72 are of less thickness than the portion 76. The net effect of this structure is that there are two small channels below 74 and 75 and one large channel below 76. The total current at zero gate voltage through the small channels, however, is greater than that through the large channel. The gate electrode is closer to the source electrode than to the drain electrode.

The depletion region below the insulation is indicated by the broken line 77. It will be understood that this extends deeper and deeper into the layer 67 as the gate voltage becomes more and more negative, with channel pinch-off occurring sooner below insulating layer portions 74 and 75 than it will below portion 76. The thickness of regions 74 and 75 is indicated as $t_a$ in FIG. 21 while the thickness of region 76 is indicated as $t_b$.

It will be noted in this embodiment that the insulated gate is located closer to the source electrode than to the drain electrode so that the bias voltage supplied to the drain electrode does not interfere with the channel region whose boundary is controlled by the depletion layer. While the gate electrode is fed with a negative voltage the depletion layer 77' is developed under the insulation layer portions 74, 75 and 76, and accordingly, a channel is formed between the depletion layer 77' and the pn junction formed between the n-type region 67 and the p-type substrate 66. The thin channel portions formed below the insulation layer portions 74 and 75 are pinched off at a lower gate voltage than is the thick channel portion below the insulation layer portion 76. The width, impurity and thickness of the channels is such that the whole current through the small channels is much larger than the current through the large channel at zero gate voltage.

Figure 22:
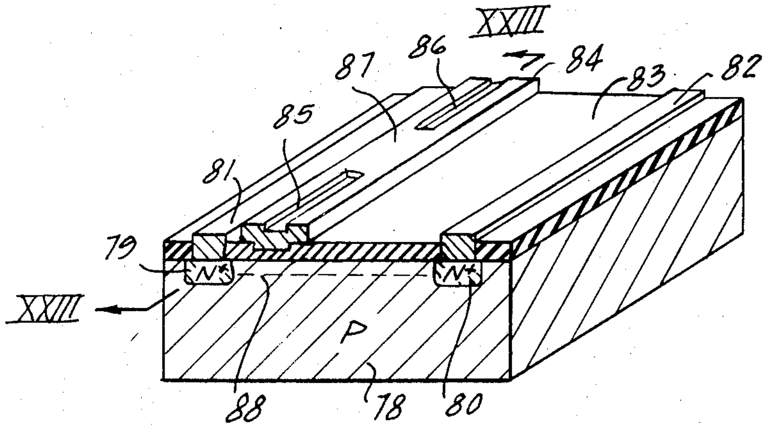
FIG. 22 is an isometric view of another form of depletion type field effect transistor embodying the teachings of the present invention.
Figure 23:
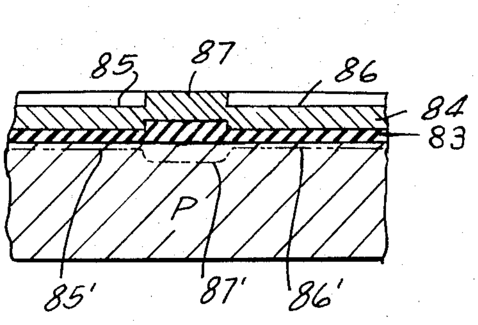
FIG. 23 is a fragmentary sectional view of the device of FIG. 22 as taken along the line XXIII—XXIII of FIG. 22.

FIGS. 22 and 23 illustrate another depletion type field effect transistor but here the channels are formed as an inversion layer. In particular, a substrate 78 of p-type semiconductor material has two longitudinally extending N+ -type impurity regions 79 and 80, which serve as source and drain regions. Over the regions 79 and 80 are deposited source and drain electrodes 81 and 82. Over the substrate surface not covered by the electrodes 81 and 82 is deposited an insulating layer 83. Over this layer 83 and closer to the source electrode 81 than to the drain electrode 82 is deposited a gate electrode 84. Portions of gate electrode 85 and 86 have a thinner portion of insulation beneath them than does a central portion 87. (See FIG. 23). As will be appreciated by those skilled in the art, an inversion layer 88 is formed below the insulating layer 83 creating an n channel resulting from trapped charges in the insulating layer. As the negative voltage on the gate is increased the channels are gradually pinched off. Three channel portions 85', 86', and 87' are present below regions 85, 86 and 87. A common channel portion, of course, lies in series with the three channel portions 85', 86', 87'. This additional series channel portion lies below the portion of the insulating layer not covered by the gate electrode 84. The channel portions 85' and 86' are pinched off before the channel portion 87' is pinched off. Further, the total current at zero gate voltage through channel portions 85' and 86' is greater than that through 87'. Also, the gate electrode is closer to the source than to the drain.

Figure 24:
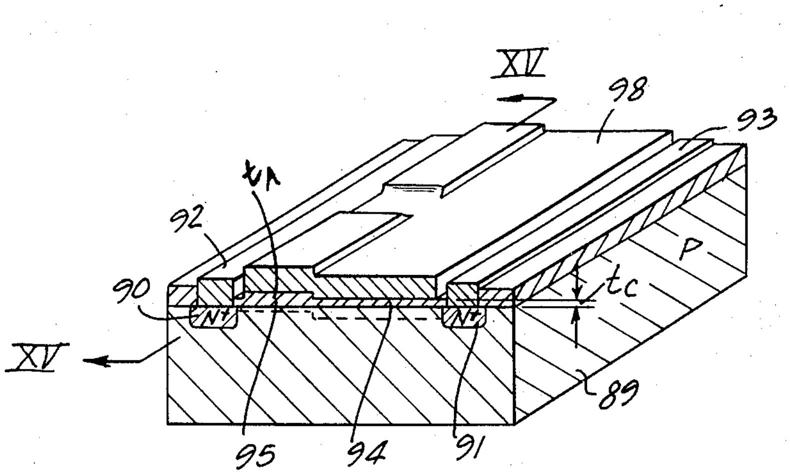
FIG. 24 is an isometric view of a metal oxide semiconductor field effect transistor of the enhancement type embodying the teachings of the present invention.
Figure 25:
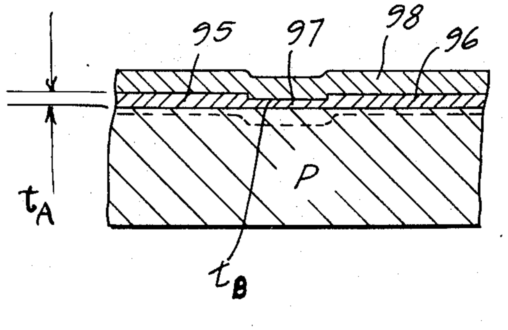
FIG. 25 is a fragmentary sectional view taken along the line XXV—XXV of FIG. 24.

FIGS. 24 and 25 illustrate an enhancement type field effect transistor controlled by a positive voltage on the gate electrode. As shown, a p-type semiconductor substrate 89 has longitudinally extending N+ source and drain regions 90 and 91 diffused into one surface of the substrate 89. Source and drain electrodes 92 and 93 are ohmic contacted on the source and drain regions 90 and 91 respectively. Over the same surface of the substrate except where the source and drain electrodes are located a layer 94 of insulating material, such as $SiO_2$, is formed. This layer has different thickness areas. In two regions 95 and 96 near the source electrode, the insulating layer is $t_A$ which is appreciably thicker than the portion $t_C$ on the drain electrode side of the thicker portions 95 and 96. Also, a portion 97 intermediate portions 95 and 96 has a thickness $t_B$ (See FIG. 25) It is important that $t_A > t_B \geq t_C$. A gate electrode 98 is formed on the insulating layer over most of its surface, it being spaced from the source electrode 92 and the drain electrode 93. As is well known, the enhancement type field effect transistor is normally off with zero gate voltage since the source and drain contacts are separated by two pn junctions connected back to back. Hence, no drain current will flow even with potential applied from drain to source (assuming the potential is less than that required to break down the reverse-biased junction).

A channel is formed by positive charges on the metalized gate including corresponding negative charges in the p-type channel material on the other side of the insulating material. With sufficient charges, the p-type material is converted into an n-type channel. The resistance of the channel then becomes a function of the thickness of the insulating layer as well as of other physical dimensions such as width and length.

In the structure of FIGS. 24 and 25 there is the effect of two channels in parallel serially connected to a third channel. The two channels are on the one hand the channel regions below insulating layer portions 95 and 96 and on the other hand the channel region below 97. The serially connected third channel region is that below 94. Assuming that a sufficiently high positive gate voltage appears on the gate electrode 98, all channel regions are turned on. As the positive voltage is decreased, pinch-off first occurs on channel regions below 95 and 96, then on the channel regions below 97.

Like the devices previously described, a variable resistance field effect transistor is obtained having a wide range of resistance and a linear ohmic characteristic.

Figure 26:
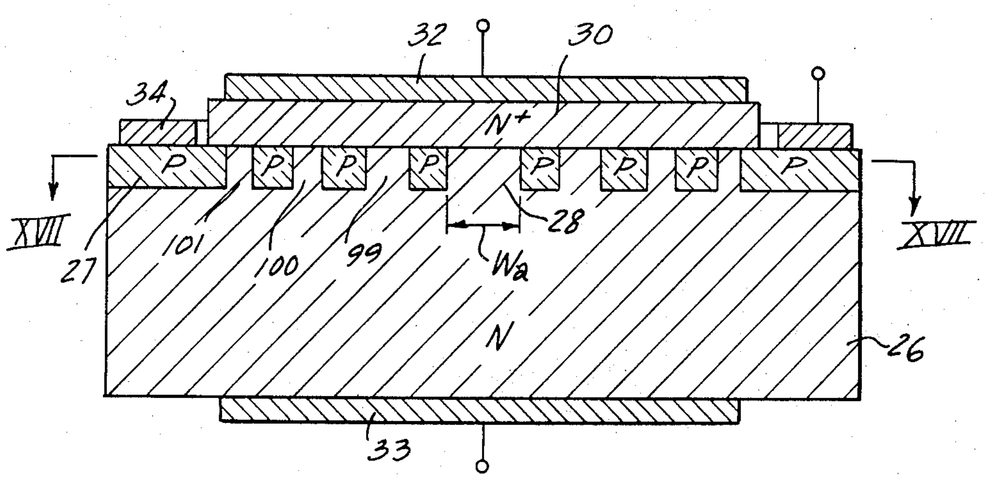
FIG. 26 is a diagrammatic sectional view of another embodiment of the present invention in the form of a junction field effect transistor having a large channel and progressively smaller channels in substantially ring shape around the center channel.
Figure 27:
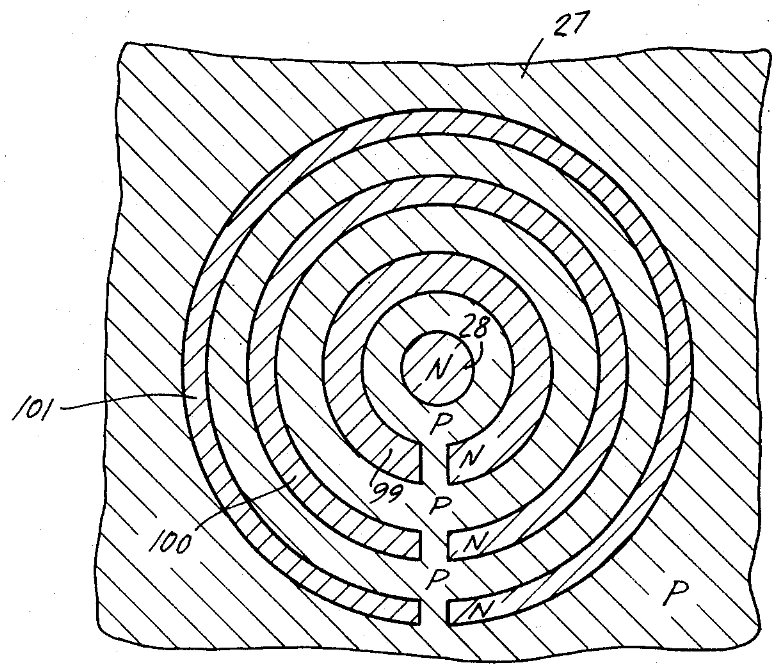
FIG. 27 is a top plan diagrammatic view showing the shape of the channels in the horizontal plane.

FIGS. 26 and 27 show a variation in the structure of FIGS. 9 and 14. Where the parts are the same or substantially similar, the same reference numerals are here applied and the description thereof will not be repeated. The difference in the structure of FIGS. 26 and 27 from FIG. 14 lies in the fact that the channels become progressively smaller from the center out. Thus, the large central channel 98 has a width $W_a$, the next channel 99 a smaller width $W_b$, the next channel 100, a still smaller width $W_{b2}$, and the outermost channel, a still smaller width $W_{b3}$. The structure is so dimensioned that the pinch-off threshold of the smaller channels are at a lower voltage than the pinch-off threshold of the large channel 98. None of the channels are pinched off at the same time.

Figure 28:
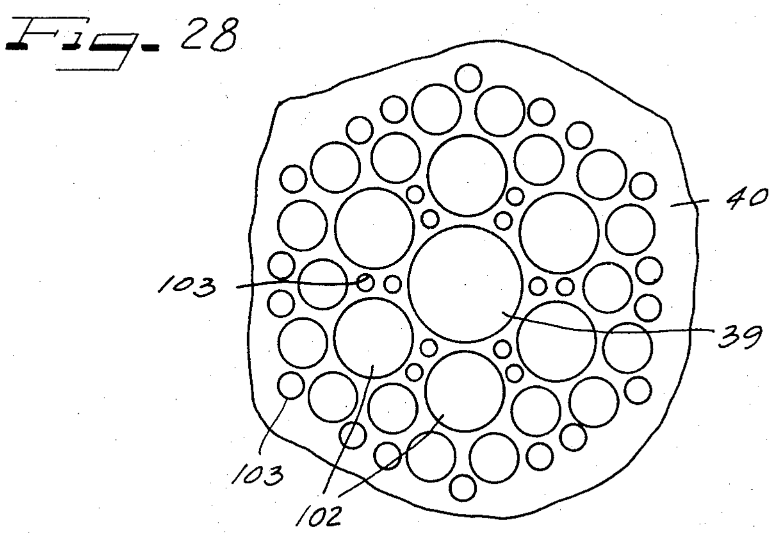
FIG. 28 is a fragmentary diagrammatic plan view of the channel arrangement of another embodiment of the present invention in which the smaller channels are of different sizes and randomly located.

FIG. 28 is a variation of the device of FIG. 13. Here, there is a large central channel 39 in a p-type channel layer. Located in a circle thereabouts are six intermediate size channels 102. Then, interspersed with channels 102 are a large number of channels 103.

FIGS. 29 to 34 show other types of junction field effect transistors embodying the present invention.

Figure 29:
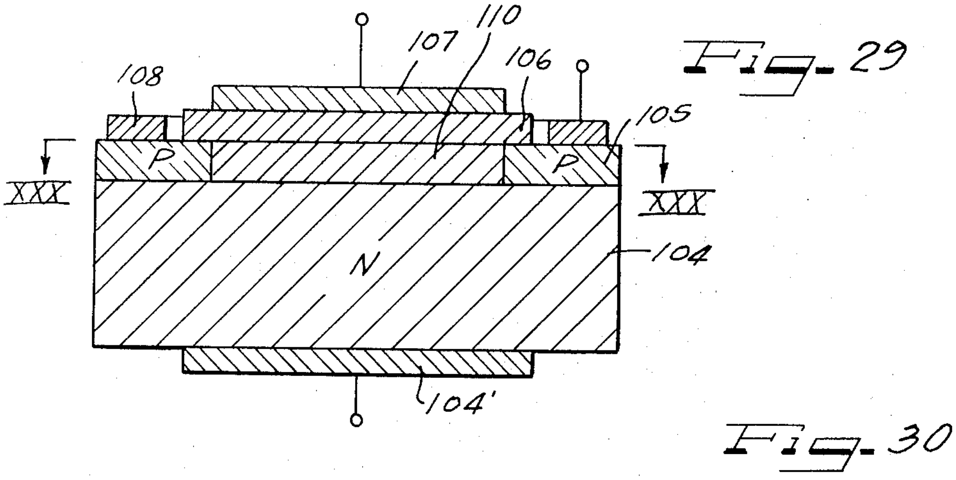
FIG. 29 is a diagrammatic sectional view of a junction type field effect transistor in which the gate region is of wedge form in the horizontal plane.
Figure 30:
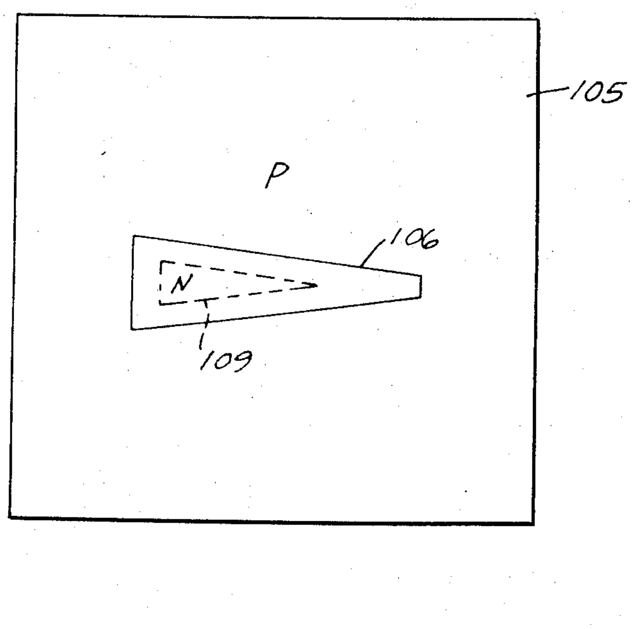
FIG. 30 is a diagrammatic view of the wedge shape channel of the device of FIG. 29 taken along line XXX—XXX of FIG. 29.
Figure 31:
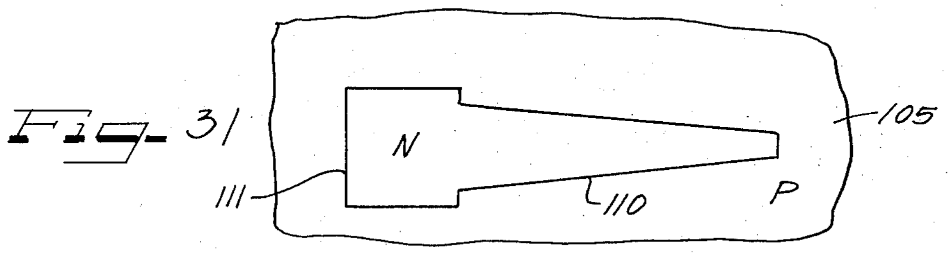
FIGS. 31, 32, 33 and 34 are diagrammatic views of other channel shapes as viewed in the horizontal for a device of the type generally illustrated in FIG. 29.

FIGS. 29 and 30 show a junction field effect transistor in which a substrate 104 is provided of n-type semiconductor material. A p-type layer 105 is formed thereon having a wedge shape window therein through which the n-type material 110 extends. A further layer 106 of n-type material is formed over the layer 105. A source electrode 107 is ohmic contacted on the layer 106 and a drain electrode 104' is ohmic contacted on the under surface of substrate 104 to provide a drain electrode. A gate electrode 108 is formed on layer 105. The wedge shape channel 110 has a wedge shape depletion region 109 which varies in size as the negative bias on the gate electrode is changed. The wedge shape channel has the same effect as a multitude of progressively smaller parallel channels, the larger end of the wedge being the equivalent of the large central channel of FIG. 9. The operation of the device as a variable resistance is the same as described in connection with FIG. 9. In examining FIG. 30, it must be borne in mind that this is a view looking down on layer 109 with parts 106, 107 and 108 removed.

In the previous embodiments of junction field effect transistors, if it is designed that the distance between the large channel and the small channel is relatively long, the electric field is concentrated only in the small channel as the small channel is pinched off. On the other hand, it is sometimes difficult in manufacture to minimize the distance between them. The gate region of this embodiment overcomes this difficulty.

Figures 32, 33, 34:
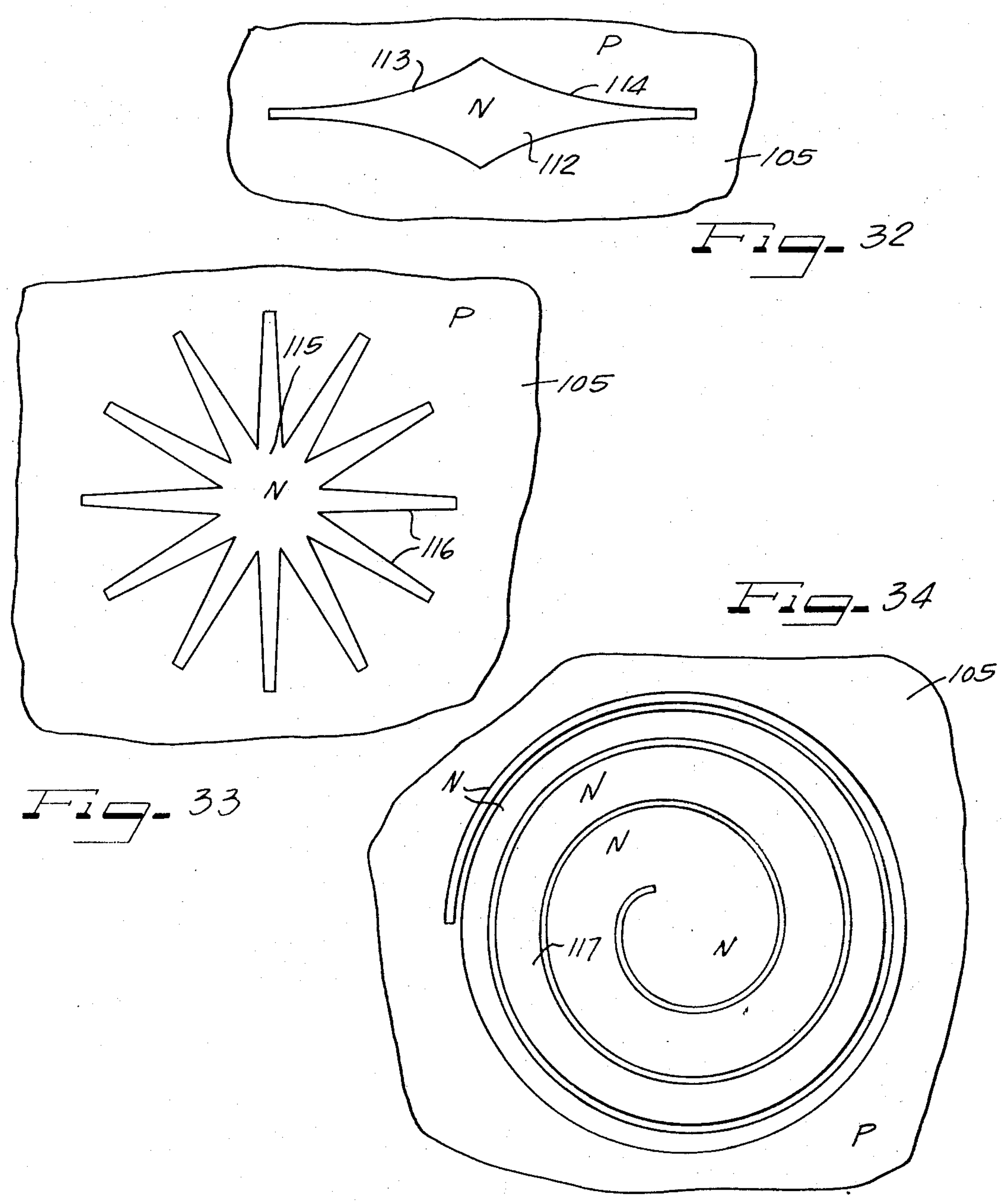

FIGS. 31, 32, 33 and 34 show different variations in the cross section of the channel from that shown in FIG. 30. The channel in FIG. 31 has a wedge-shape portion 110 and a large square shape portion 111. The channel in FIG. 32 has a large central portion 112 and gradually tapering outer portions 113 and 114. The channel of FIG. 33 has a large central portion 115 and a plurality of tapering radial portions 116. The channel 117 of FIG. 34 is of spiral shape in cross sections, so that the width of the channel progressively narrows as the spiral increases in curvature.

The channels of all forms shown in FIGS. 30 to 34 are closer to the source electrode than to the drain electrode.

Although the invention has been described in connection with the preferred embodiments, it is not to be so limited as changes and modifications may be made which are within the full intended scope of the invention as defined by the appended claims.

What I claim is:

1. A field effect transistor comprising a body of semiconductor material of a first conductive type, a first planar layer of semiconductor material of a second conductive type formed with a plurality of windows of varying sizes and with the larger window formed in a central portion of said first layer and said windows becoming progressively smaller from the central portion, said first layer of semiconductor material mounted on one surface of said body of semiconductor material and portions of said body of semiconductor material extending through said windows and flush with the surface of said first layer away from said body of semiconductor material, a second planar layer of a first conductive type mounted on said first planar layer and covering said windows but not covering outer portions of said first planar layer, a planar source electrode of electrical conductive material formed on said second planar layer, a planar drain electrode of electrical conductive material formed on a second surface of said body of semiconductor material which is opposite to said one surface, and a planar gate electrode of electrical conductive material formed on said outer portions of said first planar layer.

2. A field effect transistor according to claim 1 wherein said body of semiconductor material is n type and said first planar type is p type.

3. A field effect transistor according to claim 2 wherein said second planar layer is n+ type.

4. A field effect transistor according to claim 1 wherein said first planar area comprises a large central window and a plurality of smaller windows arranged about said large central window.

5. A field effect transistor according to claim 4 wherein said plurality of smaller windows are crescent shaped concentrically mounted about said large central window.

* * * * *